United States Patent [19]
Otaka et al.

[11] Patent Number: 5,324,950
[45] Date of Patent: Jun. 28, 1994

[54] CHARGED PARTICLE BEAM APPARATUS

[75] Inventors: Tadashi Otaka; Mikio Ichihashi, both of Katsuta, Japan

[73] Assignee: Hitachi, Ltd., Tokyo, Japan

[21] Appl. No.: 913,450

[22] Filed: Jul. 15, 1992

[30] Foreign Application Priority Data

Jul. 18, 1991 [JP] Japan .................. 3-178365

[51] Int. Cl.$^5$ .......................................... H01J 37/252
[52] U.S. Cl. .......................... 250/441.11; 250/310
[58] Field of Search ............. 250/441.11, 440.1, 310; 313/7; 412/48, 49, 50

[56] References Cited

U.S. PATENT DOCUMENTS

| | | | |
|---|---|---|---|
| 2,899,556 | 8/1959 | Schopper et al. | 250/441.11 |
| 3,969,039 | 7/1976 | Shoulders | 250/441.11 |
| 4,295,072 | 10/1981 | Todokoro et al. | 250/441.11 |
| 4,823,006 | 4/1989 | Danilatos et al. | 250/441.11 |
| 4,833,362 | 5/1989 | Crewe | 313/7 |

FOREIGN PATENT DOCUMENTS

| | | |
|---|---|---|
| 257394 | 3/1988 | European Pat. Off. |
| 462554 | 12/1991 | European Pat. Off. |
| 1354784 | 2/1966 | France |
| 1020725 | 2/1966 | United Kingdom |

OTHER PUBLICATIONS

Yamazaki, Y. et al., "Development of the field emission electron gun integrated in the sputter ion pump", Journal of Vacuum Science and Technology: Part B, vol. 9, No. 6, Dec. 1991, pp. 2967-2971.

Primary Examiner—Paul M. Dzierzynski
Assistant Examiner—Kiet T. Nguyen
Attorney, Agent, or Firm—Antonelli, Terry, Stout & Kraus

[57] ABSTRACT

Improvements in a charged particle beam apparatus are contemplated and especially a column structure incorporating a superhigh vacuum evacuation system is provided which is reduced in size and weight and has high performance. In order to evacuate surrounding space of a charged particle source to superhigh vacuum, ion pumps are built in a vacuum enclosure of a column. Each ion pump includes a magnet unit 15, a yoke and an electrode, and the magnet unit per se is built in the vacuum enclosure. A charged particle beam focusing optics for focusing and deflecting a charged particle beam from the charged particle beam source is arranged in a space which is defined interiorly of the yoke. The column structure can be reduced in size and weight and a charged particle beam apparatus having high performance can be obtained.

38 Claims, 5 Drawing Sheets

CHARGED PARTICLE BEAM APPARATUS

BACKGROUND OF THE INVENTION

This invention relates to charged particle beam apparatus. More particularly, the present invention relates to improvements in charged particle beam apparatus using a finely focused electron or ion beam such as for example scanning electron microscopes, Auger electron analyzers and ion microscopes and especially, to size reduction of a column containing a charged particle beam generator and a charged particle beam focusing optics of the apparatus.

In the charged particle beam apparatus using a finely focused electron or ion beam such as scanning electron microscope, Auger electron analyzer, ion microscope and secondary ion mass analyzer, a charged particle source of field emission type has hitherto been used widely for the sake of improving resolution. To stably operate the charged particle source of field emission type, however, the interior space of the charged particle source must be maintained at superhigh vacuum condition and to this end, a method has conventionally been employed wherein an evacuation opening is formed directly in the outer wall of vacuum enclosure of a charged particle source of field emission type, a superhigh vacuum pump such as for example an ion pump is connected to the evacuation opening through connection piping and the pump is operated to evacuate the surrounding space of the field emission type charged particle source to a requisite high vacuum (for example, see JP-A-55-148357).

When the aforementioned evacuation method is employed, however, the connection piping has to be arranged exteriorly of the column, thus making the construction of the evacuation system per se complicated and to meet maintenance of necessary evacuation capability, sufficient reduction in size of the connection piping cannot be permitted. If the connection piping is forced to be reduced in size, then the evacuation conductance is decreased and the necessary evacuation capability cannot be obtained. Accordingly, sufficient reduction in size of the overall column structure including the evacuation system for the charged particle source is difficult to achieve.

SUMMARY OF THE INVENTION

An object of the invention is to reduce the size of an arrangement for evacuating and keeping in a superhigh vacuum the column, especially, surrounding space of the charged particle beam source.

Another object of the invention is to reduce the size of the column per se and consequently the charged particle beam apparatus per se.

Still another object of the invention is to provide a charged particle beam apparatus capable of providing high resolution even in a region of low accelerating voltage.

Still another object of the invention is to provide a charged particle beam apparatus having, inside the column, a focusing optics which is so improved as to be immune from the influence of external magnetic field.

According to the invention, to accomplish at least one of the above objects, an ion pump for evacuating surrounding space of the charged particle source to vacuum is built in the interior space of the column housing the charged particle source and charged particle beam focusing optics, and a permanent magnet is used as means for generating a magnetic field for drive of the ion pump, the permanent magnet being arranged in the interior space of the column.

In accordance with an embodiment of the invention the charged particle beam focusing optics is surrounded by a magnetic circuit member adapted to form the magnetic field for operating the ion pump built in the interior space of the column.

In accordance with another embodiment of the invention, for the sake of maintaining surrounding space of the charged particle source at superhigh vacuum condition, a second ion pump for vacuum evacuating the interior space of the charged particle beam focusing optics is arranged in the interior space of the column in addition to the first ion pump adapted to vacuum evacuate surrounding space of the charged particle source so that differential evacuation is effected between the surrounding space of the charged particle source and the interior space of the charged particle beam focusing optics.

Further, for the sake of preparatorily evacuating surrounding space of the charged particle source to a vacuum degree at which the ion pump is permitted to be operated, a first communication opening for communicating surroundings of the charged particle source with a preparatory evacuation system is provided and a switching valve for switching the first communication opening is provided.

A second communication opening is also provided between the first ion pump for vacuum evacuating surrounding space of the charged particle source and the second ion pump for vacuum evacuating the interior space of the charged particle beam focusing optics, and evacuation conductance through the second communication opening is made to be variable.

In accordance with an embodiment of the invention, a casing of the column housing the charged particle source is made of a magnetic material so that the column casing may also serve as part of the magnetic circuit member adapted to form the magnetic field for operating the ion pump. Conveniently, the column casing may be made of the magnetic material at at least its portion constituting the magnetic circuit.

In accordance with an embodiment of the invention, for the sake of eliminating disturbance due to magnetic field such as misalignment of charged particle beam, the charged particle beam focusing optics is arranged interiorly of a yoke constituting a part of the magnetic circuit adapted to form the magnetic field for operating the ion pump so that the charged particle beam focusing optics may be shielded magnetically from external magnetic field and ion-pump magnetic field.

In accordance with an embodiment of the invention, for the sake of obtaining high resolution even in a region of low accelerating voltage, the objective lens in the charged particle beam focusing optics is formed of an electrostatic lens.

According to the present invention described previously, the following operation and effect can be attained.

Since surrounding space of the charged particle source are evacuated to a superhigh vacuum directly by the ion pump incorporated in the column, stable charged particle beam emission characteristics can be obtained. In addition, by virtue of the incorporation of the ion pump in the column, the overall column structure can be reduced in size and weight.

Further, by using the ion pump incorporated in the column, surrounding space of the charged particle source are evacuated in differential fashion from the specimen chamber and therefore even when the specimen chamber is in low vacuum condition, surrounding space of the charged particle source can always be maintained at superhigh vacuum condition.

Moreover, since the charged particle beam focusing optics is arranged interiorly of the magnetic circuit member adapted to form the magnetic field for operating the ion pump, the charged particle beam focusing optics is immune from disturbance by magnetic field.

Furthermore, by making the objective lens in the charged particle beam focusing optics be an electrostatic lens, aberration of the objective lens at low accelerating voltage can be reduced, thereby realizing a charged particle beam apparatus having high resolution.

BRIEF DESCRIPTION OF THE DRAWINGS

These and other objects and technical advantages of the present invention will be readily apparent from the following description of the preferred exemplary embodiments of the invention in conjunction with the accompanying drawings, in which.

DESCRIPTION OF THE PREFERRED EMBODIMENTS

The invention will now be described in greater detail by way of example with reference to the accompanying drawings.

In embodiments of the invention to be described hereinafter, the invention will be described as being applied principally to an apparatus using a focused electron beam, especially, a scanning electron microscope but the scope of the invention is not limited thereto only and the present invention may obviously be applicable to general focused charged particle beam applied apparatus including an apparatus using a focused ion beam.

Figure 1:
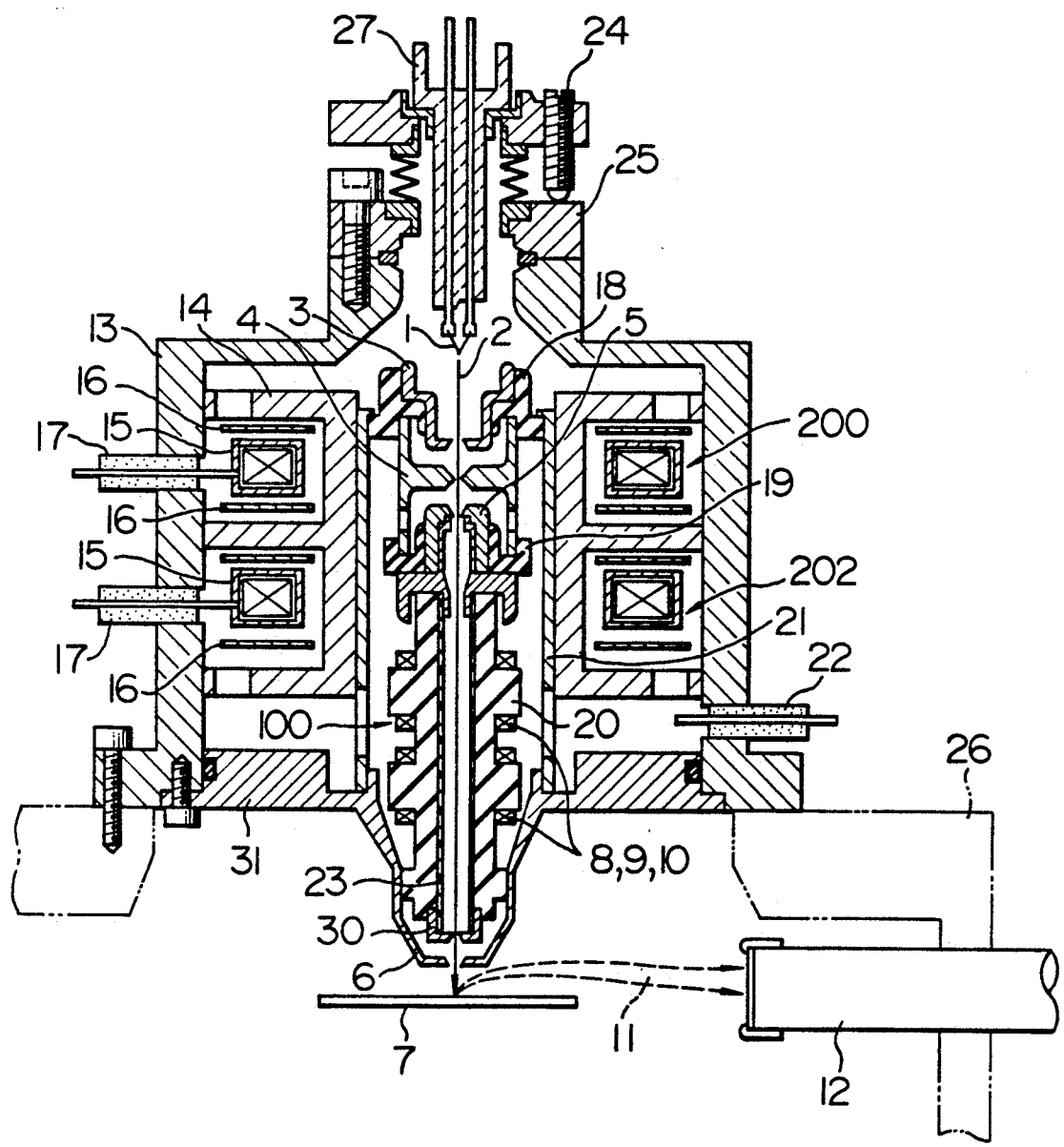
FIG. 1 is a longitudinal sectional view showing schematic construction of a scanning electron microscope according to an embodiment of the invention.

FIG. 1 is a longitudinally sectional schematic diagram showing the construction of a scanning electron microscope according to an embodiment of the invention. Details of the construction and operation of the scanning electron microscope will be described below.

Referring to FIG. 1, an electron source 1 for emitting an electron beam and an electron beam focusing optics 100 for focusing an electron beam 2 from the electron source 1 on a specimen 7 are housed in a casing 13 serving as a column. Also incorporated in the casing 13 are two ion pumps 200 and 202 which are respectively adapted to evacuate to vacuum surrounding space of the electron source 1 and an interior space of the electron beam focusing optics 100. The bottom of the casing 13 is mounted airtightly to the top wall of a specimen chamber 26.

Used as the electron source 1 is a field emission chip. The electron source 1 is mounted through an insulator 27 to a flange 25 which is secured airtightly to the top end of the casing 13 through a metallic packing. The electron source 1 is so constructed as to have an axial position and an inclination to the optical axis which can be adjusted by means of axis adjusting screws 24. By applying a suitable drawout voltage between the electron source 1 and a draw-out electrode 3, field emission of electron beam 2 from the electron source 1 can be effected.

The electron beam focusing optics 100 is of electrostatic lens construction thoroughly and in this embodiment it has a lens electrode group including the draw-out electrode 3, a first lens 4, a second lens 5, a liner tube 23, a third electrode 30 and a final electrode 6. These electrodes of the lens electrode group are insulated from each other through insulating rings 18 and 19 and an insulating sleeve 20 and they are built in an alignment sleeve 21 with high accuracy. The respective lens electrodes are applied with requisite voltages through inlet terminals 22 provided in the side wall of the casing 13.

Electron beam 2 drawn out of the electron source 1 by means of the draw-out electrode 3 is finely focused on the specimen 7 by means of the electrostatic type electron beam focusing optics 100 comprised of the first lens electrode 4, second lens electrode 5, third lens electrode 30 and final electrode 6. In order to produce stable emission of electron current from the field emission type electron source 1 through field emission, the vicinity or surroundings of this electron source 1 must be placed and kept in the condition of a superhigh vacuum of about $10^{-8}$ pa. For the sake of obtaining the superhigh vacuum, in the present embodiment, ion pumps 200 and 202 each comprised of a magnet unit 15, an electrode 16 and a yoke 14 are incorporated in the casing 13 to surround the electron beam focusing optics. A permanent magnet may be used as a magnet for generating a magnetic field necessary to operate each ion pump 200 or 202. It should be appreciated that the permanent magnet is placed in vacuum inside the casing 13. The two ion pumps are not always necessary and only one ion pump may be employed.

Figure 2:
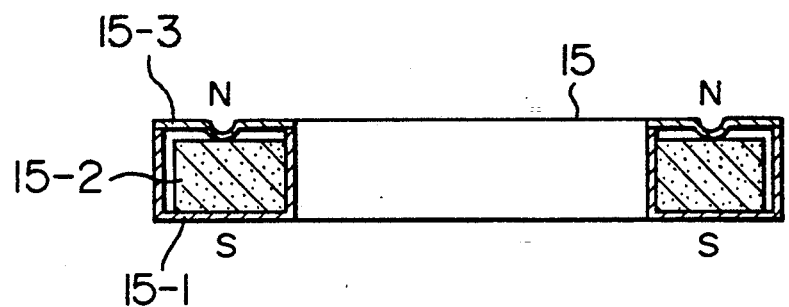
FIG. 2 is a sectional view showing an example of construction of a magnet unit in an ion pump shown in FIG. 1.

An example of construction of the magnet unit 15 is shown in FIG. 2. A ring-shaped magnet (permanent magnet) 15-2 magnetized in the vertical direction is hermetically enclosed with cases 15-1 and 15-3. These cases may be made of a non-magnetic material, for example, stainless steel. The magnet unit 15 is placed axisymmetrically in vacuum surrounding space around the electron beam passage and magnetic flux generated from the magnet unit is efficiently led to a space between upper and lower components of the electrode 16 through a magnetic circuit constructed of the yoke 14 and casing 13.

Figure 3:
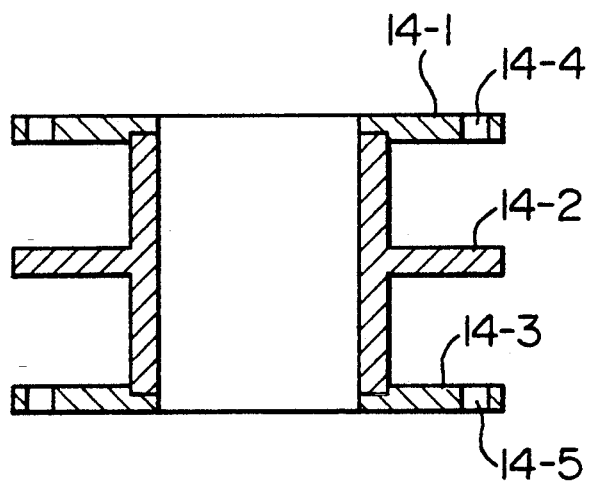
FIG. 3 is a sectional view showing an example of construction of a magnetic yoke in the ion pump shown in FIG. 1.

An example of construction of the yoke 14 is shown in FIG. 3. The yoke 14 includes an upper plate 14-1, a separator 14-2 and a lower plate 14-3 which are made of a magnetic material such as for example pure iron or permalloy. This yoke structure meets the case where the upper and lower two ion pump units 200 and 202 are provided as shown in FIG. 1. The peripheral portion of the upper plate 14-1 is formed with a plurality of evacuation openings 14-4 through which the interior space of the the upper ion pump unit 200 communicates with a space (electron source chamber) accommodating the electron source 1. Similarly, the peripheral portion of the lower plate 14-3 is also formed with a plurality of evacuation openings 14-5.

While the aforementioned magnet unit 15 is built in the interior space of the magnetic circuit formed of the yoke 14 constructed as above and the casing 13 so as to be used as an anode electrode (cases 15-1, 15-2 and 15-3 serving as the anode electrode) for the ion pump, the electrode 16 having ring-shaped upper and lower components respectively disposed above and beneath the magnet unit 15 is used as a cathode electrode for the ion pump. The electrode 16 is made of an active metal having ability to adsorb gas molecules, for example, titanium (Ti) and its upper and lower components are both maintained at earth potential. By virtue of the above structure in which the magnetic unit 15 plays the part of the anode electrode for the ion pump, the ion pump per se can be reduced in size. Also, by adopting the above structure in which the magnet unit 15 is incorporated in the interior space of the magnetic circuit comprised of the yoke 14 and casing 13, the electron source and electron beam focusing optics can effectively be shielded magnetically so as not to be affected by a magnetic field from the magnet unit 15.

With the above construction, when a positive high voltage (4 to 5 kV) is applied to the magnet unit (plate) 15 through a high voltage inlet terminal 17 provided in the side wall of the casing 13, Penning discharge is generated in the space surrounding the magnet unit 15 and the surface of the electrode (cathode) of titanium is sputtered, resulting in a phenomenon that sputtered titanium atoms adsorb the residual gas to perform operation of ion pump. More specifically, when the ion pump of the first stage (upper ion pump unit) 200 is actuated, the interior of the electron source chamber can be evacuated to a superhigh vacuum and when the ion pump of the second stage (lower ion pump unit) 202 is actuated, the interior space of the electron beam focusing optics can be evacuated to a superhigh vacuum. The ion pump 202 of the second stage adapted to evacuate the interior space of the electron beam focusing optics to a high vacuum in order to maintain the superhigh vacuum condition inside the electron source chamber plays a role of a so-called differential evacuation pump. In other words, by evacuating the interior space of the electron beam focusing optics to a high vacuum by means of the ion pump 202 of the second stage, the vicinity of the electron source 1 can be maintained at the conduction of a superhigh vacuum of about $10^{-8}$ pa even when the vacuum degree inside the specimen chamber 26 is so small as to amount to about $10^{-4}$ pa.

Initial evacuation is needed for start-up evacuation by which the electron source chamber and the interior space of the electron beam focusing optics are evacuated to the vacuum degree (about $10^{-4}$ pa) at which the aforementioned ion pumps of the first and second stages are allowed to be operated. A method of the initial evacuation will be described below.

Figure 4:
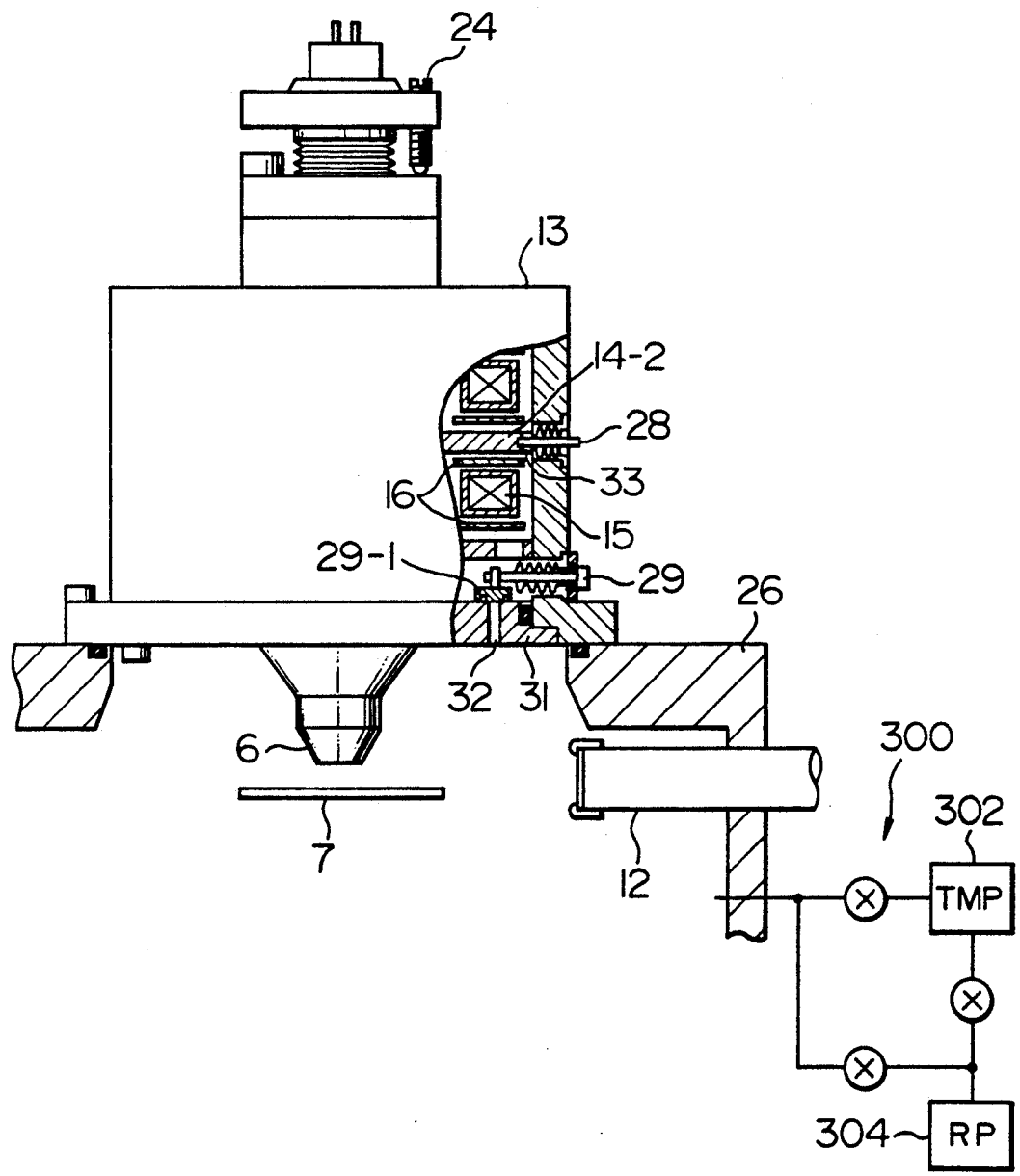
FIG. 4 is a view, partially longitudinally sectioned, showing schematic construction of a scanning electron microscope according to another embodiment of the invention.

The scanning electron microscope has a preparatory evacuation unit 300 which permits the initial evacuation and an example of construction of the unit 300 is shown, in partially sectional form, in FIG. 4. The interior space of the specimen chamber 26 is initially evacuated to a vacuum degree of about $10^{-4}$ pa by means of vacuum pumps (turbo molecular pump 302 and rotary pump 304) for evacuation of the specimen chamber. The specimen chamber interior space and the space surrounding the ion pump of the second stage are partitioned from each other by a partition wall 31 in which a communication opening 32 is formed, and a preparatory evacuation valve 29 is provided in association with the opening 32. The opening 32 can be switched (opened or closed) by manipulating, exteriorly of vacuum, movement of a valve member 29-1 engageable with the upper edge of the opening 32 through a bellows. In FIG. 4, the same members as those in FIG. 1 are designated by the same reference numerals.

Similarly, the chambers of the ion pumps of the first and second stages are partitioned from each other by a separator 14-2 and a communication opening 33 is formed in a part of the separator. A communication valve 28 for opening or closing the opening 33 is provided in association therewith. With the above construction, when the preparatory evacuation valve 29 and communication valve 28 are opened while the vacuum pumps for evacuation of the specimen chamber interior being operated, the interior space of the electron beam focusing optics and the interior of the electron source chamber can be evacuated initially to a vacuum degree of about $10^{-4}$ pa through the communication openings 32 and 33. Thus, in this case, the vacuum pumps for evacuation of the specimen chamber interior are used as preparatory evacuation pumps for initial evacuation of the interior spaces of the electron beam focusing optics and electron source chamber. Preferably, the preparatory evacuation valve 29 and communication valve 28 may be constructed so as to be not only switchable to merely on-off control the openings 32 and 33 but also adjustable independently and desirably in aperture, when opened, to desirably adjust evacuation conductance through the openings 32 and 33. By virtue of this construction, conditions of preparatory evacuation for the interior spaces of the electron beam focusing optics and electron source chamber can be changed desirably.

When the requisite initial evacuation is completed in the manner described above, the preparatory evacuation valve 29 is closed and at least one of the upper and lower ion pumps is then actuated to evacuate the interior spaces of the electron source chamber and electron beam focusing optics to a high vacuum. As a result, the interior spaces are kept in condition of a high vacuum of about $10^{-6}$ pa. Thereafter, the communication valve 28 is closed and then the interior spaces of the electron source chamber and electron beam focusing optics are evacuated by means of the corresponding independent ion pumps. Through this, the vacuum degree in the space surrounding the electron source 1 can be promoted to a superhigh vacuum of about $10^{-8}$ pa.

In order to draw electrons out of the electron source 1 through field emission, a draw-out voltage of about 4 to 6 kV is applied between the electron source 1 and draw-out electrode 3. More specifically, when electron beam 2 irradiates the specimen 7 at a final accelerating voltage of, for example, 1 kV, '1 kV is applied to the field emission chip of the electron source 1 and a voltage of +3 to +5 kV is applied to the draw out electrode 3 to provide a draw-out voltage of exactly 4 to 6 kV, thus ensuring that electron beam 2 of a sufficient current value can be obtained at the desired accelerating voltage. Under the application of a positive voltage of about 1 kV to 3 kV to the first lens electrode 4 and the application of a higher positive voltage of about 5 kV to 10 kV to the second lens electrode 5, an electric field formed by the draw-out electrode 3, first lens electrode 4 and second lens electrode 5 acts as an electrostatic focusing lens by which the electron beam 2 drawn out of the electron source 1 by means of the draw-out electrode 3 is focused and caused to enter the liner tube 23. The second lens electrode 5 and third lens electrode 30 are connected through the liner tube 23 to assume the same potential, and an electric field formed between the third lens electrode 30 and the final electrode 6 at earth potential acts as an electrostatic objective lens by which the electron beam 2 irradiating the specimen 7 is focused finely.

In order that the electric field formed between the aforementioned third lens electrode 30 and final electrode 6 acts as the electrostatic objective (focus) lens which exerts on the electron beam reaching that electric field, it is necessary for voltage applied to the third lens electrode 30 to be positive relative to voltage on the final electrode 6. (Conversely, with a positively charged ion beam used, the third lens electrode 30 is applied with voltage which is negative relative to voltage on the final electrode 6.) By applying voltages in this manner, the electron beam 2 can be focused finely on the specimen by the lens electric field formed between the two electrodes 30 and 6.

When damage of a semiconductor specimen and charging thereon due to the irradiation of electron beam are taken into account, the final accelerating voltage of the electron beam is typically 0.5 to 2 kV. The electron beam drawn out of the electron source 1 is focused by the lens electric field formed by the drawout electrode 3, first lens electrode 4 and second lens electrode 5 as described previously and at the same time accelerated by an electric field formed between the first lens electrode 4 and second lens electrode 5, so that the electron beam travels through the inner space of the liner tube 23 while being accelerated at the maximum energy. Then, in the inner space of liner tube 23 in which the electron beam is accelerated at the maximum energy, deflection for scanning the electron beam is carried out. A deflection coil 8 is provided exteriorly of the liner tube 23 by being wound along with an alignment coil 9 and a stigmator coil 10 in lap winding fashion so that the focused electron beam may be deflected and scanned two dimensionally on the specimen surface by means of the deflection coil 8.

The construction described above permits the electrostatic objective lens formed by the third lens electrode 30 and final electrode 6 to be operated at a short focal distance and with less aberration, thereby enabling the scanning electron microscope to have high resolution.

Figure 5:
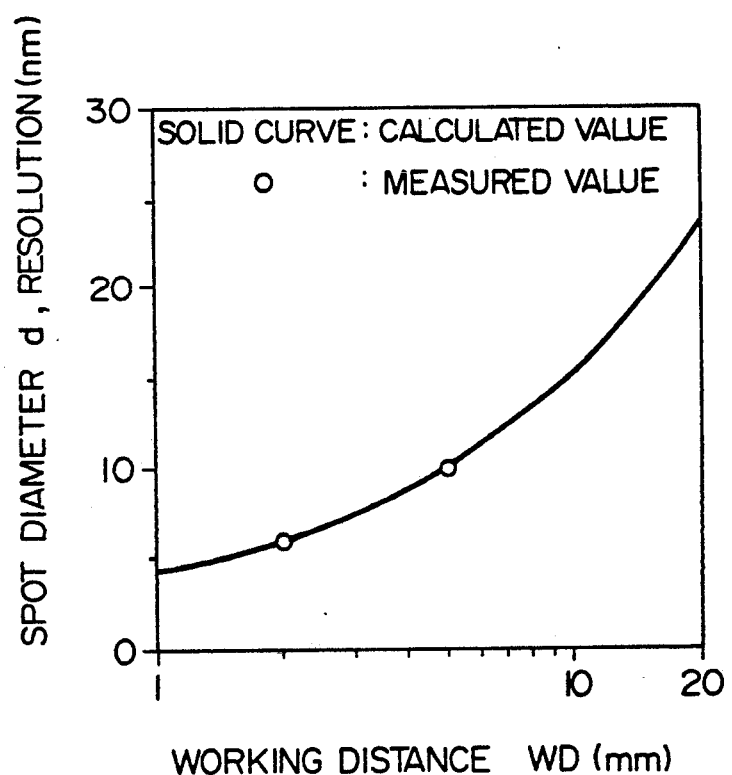
FIG. 5 is a graph showing the relation between working distance and resolution obtained with the FIG. 1 scanning electron microscope.

As an example, when in the aforementioned electron beam focusing optics using the electrostatic lens the final accelerating voltage of the electron beam was 1 kV and distance (working distance) WD from the bottom of final electrode 6 to the surface of specimen 7 was 2 mm, the irradiating spot diameter (probe diameter) of electron beam on the specimen surface having a value of 5 to 6 nm was obtained, proving that sufficiently high resolution could be obtained even at a low accelerating voltage. In this case, the distance between the third lens electrode 30 and final electrode 6 was 2 mm. Then, the working distance WD was related to obtained spot diameter d (resolution) as shown in FIG. 5. At that time, emission current from the electron source was 10 $\mu$A and probe current (current value of the electron beam impinging on the specimen) was 20 pA.

Secondary electrons 11 emitted from the specimen 7 under the irradiation of electron beam 2 may be detected by a secondary electron detector 12. The final electrode 6 is maintained at earth potential as described previously and therefore, even with the objective lens of electrostatic type used, inconvenience that the locus of secondary electrons is disturbed by electric field of the objective lens will not be caused and the secondary electrons can be detected efficiently. In this connection, U.S. patent applications No. 07/686922 filed on Apr. 4, 1991, No. 07/714018 filed on Jun. 12, 1991 and No. 07/717018 filed Jun. 18, 1991 are incorporated herein by reference.

By adopting the electron beam focusing optics having the construction as described above, the construction of the overall column can significantly be reduced in size. To describe a specific example of structural dimension, even when the outer diameter of the electron beam generator is 34 mm$\phi$ and the outer diameter of the column incorporating the ion pumps and the electron beam focusing optics for focusing and deflecting the electron beam is about 80 mm$\phi$, the overall length (height) of the column is 130 mm, proving the size reduction; and besides weight of the overall column is reduced to 1/100 or less of that of the prior art column structure. The structural dimension of the magnet unit 15 is 59 mm in outer diameter, 41 mm in inner diameter and 8 mm in height. Used as the permanent magnet is made of rare earth magnet (doughnut shaped), as the case is made of stainless steel, and as the cathode is made of titanium.

The embodiment detailed hereinbefore can advantageously realize a very compact column structure and provide high resolution. Further, since the superhigh vacuum condition can be realized easily in the electron source, the electron beam can be drawn stably. Furthermore, structurally, the electron beam path inside the column is so shielded as not to be magnetically affected by a magnetic field for driving the ion pump and is also shielded completely magnetically by the casing of magnetic material which surrounds the column so as to be significantly immune from disturbance of external magnetic field.

Figure 6:
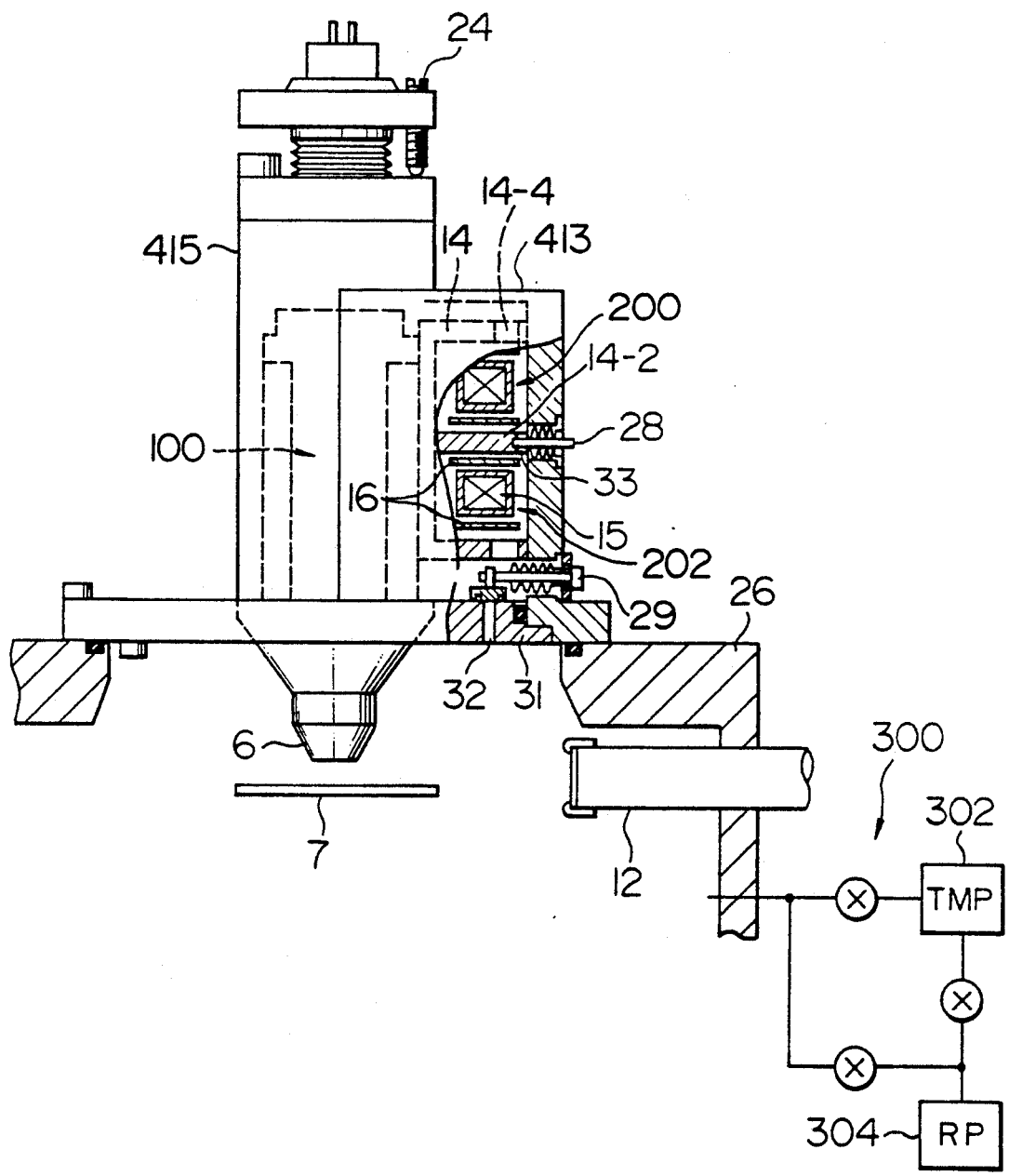
FIG. 6 is a view, partially longitudinally sectioned, showing schematic construction of a scanning electron microscope according to still another embodiment of the invention.

FIG. 6 shows another embodiment. In FIG. 4, the same members as those in FIGS. 1 and 4 are designated by the same reference numerals and their description will be omitted.

In an electron microscope of this embodiment, a modified casing 413 is used, so that the optics is housed in a column 415 having a reduced diameter and the casing 413 covers the half of the column 415. In this embodiment, yoke 14, magnet unit 15 and cathode electrode 16 have each a halved-ring shape.

The invention has been described by referring to various embodiments but it is in no way limited to the specific construction shown in these embodiments and maybe modified and applied in various ways. In the foregoing embodiments, the invention has been described as being applied to the scanning electron microscope but it may also be applied to other apparatus using a focused electron beam such as for example an electron beam distance measuring apparatus, an Auger electron analyzer, an electron beam drawing apparatus and an electron beam tester; and besides it may also be applicable easily to apparatus using a focused ion beam such as an ion microscope, a focused ion beam apparatus and a secondary ion mass analyzer when applied with such a simple change as changing the polarity of application voltage.

The magnet and the electrodes used in the foregoing embodiments are continuous in the circumferential direction but they may be discrete circumferentially. Further, one of them may be discrete circumferentially.

As is clear from the foregoing detailed description, according to the invention, the interior space of the charged particle source requiring superhigh vacuum is evacuated to high vacuum by using the ion pump built in the column and the permanent magnet is particularly used as a magnetic field generating source adapted to generate a magnetic field for driving the ion pump, the permanent magnet being of a hermetic structure and built in the vacuum chamber, whereby the evacuation system for evacuating the interior space of the charged particle source can be reduced in size significantly; and in addition, the charged particle beam focusing optics formed of electrostatic lenses is arranged interiorly of the yoke constituting the magnetic circuit adapted to guide the magnetic field for driving the ion pump, whereby the column as a whole can be reduced significantly in size and weight.

Further, since the charged particle beam focusing optics is doubly shielded magnetically by means of the yoke member constituting the magnetic circuit for formation of the magnetic field for drive of the ion pump and the casing made of a magnetic material, a charged particle beam apparatus can be obtained which is sufficiently immune from an external disturbance magnetic field.

We claim:

1. A charged particle beam apparatus comprising:
    a charged particle beam source for emitting a charged particle beam;
    a charged particle beam focusing optics for focusing the charged particle beam from said charged particle beam source on a surface of a specimen;
    a column for housing said charged particle beam source and said optics; and
    an ion pump including a permanent magnet, said permanent magnet being hermetically covered with a non-magnetic electrically conductive material,
    wherein said ion pump is arranged in a space inside said column and surrounding said charged particle beam focusing optics and is operated to evacuate surrounding said space of said charged particle beam source to vacuum.

2. A charged particle beam apparatus according to claim 1 wherein said optics is arranged interiorly of said column and substantially coaxially therewith to define said space as an annular space.

3. A charged particle beam apparatus according to claim 2 wherein said ion pump is arranged in said annular space, wherein said permanent magnet is a ring-shaped permanent magnet magnetized in a direction parallel to an axial direction of said column, a ring-shaped electrode having a paired component which are spaced apart from each other in the axial direction of said column to sandwich said ring-shaped permanent magnet, and a magnetic circuit arranged to surround said ring-shaped permanent magnet and said ring-shaped electrode and adapted to lead lines of magnetic force from said ring-shaped permanent magnet to form a magnetic field in a space between said ring-shaped permanent magnet and said ring-shaped electrode.

4. A charged particle beam apparatus according to claim 3 wherein said ring-shaped electrode having said paired component is used as a cathode electrode, said material covering said ring-shaped permanent magnet is used as an anode electrode, and said ion pump is operated by applying a high voltage between said cathode and anode electrodes.

5. A charged particle beam apparatus according to claim 3 wherein said magnetic circuit includes a cylindrical yoke portion arranged exteriorly of said ring-shaped permanent magnet and surrounded said charged particle beam focusing optics, ring-shaped yoke portions extending laterally outwardly of said cylindrical yoke portion to sandwich said ring-shaped electrode and said ring-shaped permanent magnet, and a circumferential wall of said column to which said ring-shaped yoke portions contact, said column being made of a dielectric material.

6. A charged particle beam apparatus according to claim 1 further comprising a preparatory evacuation system for preparatorily evacuating the interior space of said column, a communication opening provided between said column and said preparatory evacuation system through which the interior space of said column communicates with said preparatory evacuation system, and means for changing evacuation conductance through said communication opening.

7. A charged particle beam apparatus according to claim 6 further comprising a specimen chamber communicating with said column, said preparatory evacuation system being connected to said specimen chamber and said communication opening being formed in a partition wall between said specimen chamber and said column.

8. A charged particle beam apparatus according to claim 1 further comprising a second ion pump arranged in said space surrounding said charged particle beam focusing optics.

9. A charged particle beam apparatus according to claim 1 wherein said charged particle beam source is an electron beam source of field emission type.

10. A charged particle beam apparatus according to claim 1 wherein said charged particle beam focusing optics includes an electrostatic type objective lens for focusing said charged particle beam from said charged particle beam source on the specimen, and said electrostatic type objective lens has two lens electrodes arranged to oppose to each other, of which a first electrode is close to said charged particle source and a second electrode is close to said specimen, whereby when said charged particle beam is a negatively charged particle beam, a potential on said first electrode is kept to be positive relative to a potential on said second electrode while said charged particle beam is a positively charged particle beam, a potential on said first electrode is kept to be negative relative to a potential on said second electrode.

11. A charged particle beam apparatus according to claim 10 wherein said charged particle beam focusing optics further includes deflection means for scanning the charged particle beam to be irradiated on said specimen two-dimensionally on the surface thereof, and said deflection means is so constructed as to deflect and scan said charged particle beam in a space inside said charged particle beam focusing optics and in which said potential is kept at the same polarity as that of said potential on said first electrode relative to said potential on said second electrode.

12. A charged particle beam apparatus according to claim 1, wherein the hermetical non-magnetic electrically conductive material includes a deformable portion.

13. A charged particle beam apparatus according to claim 12, wherein said deformable portion is in a form of a ring shaped diaphragm groove.

14. A charged particle beam apparatus comprising:
a charged particle beam source for emitting a charged particle beam;
a charged particle beam focusing optics for focusing the charged particle beam from said charged particle beam source on a surface of a specimen;
a column for housing said charged particle beam source and said optics; and
a first ion pump including a permanent magnet, said first ion pump being arranged in a space inside said column and surrounding said charged particle beam focusing optics and being operated to evacuate surrounding space of said charged particle beam source to vacuum;
a second ion pump arranged in said space surrounding said charged particle beam focusing optics; and
a partition wall for dividing said space into two divisional spaces, an opening formed in said partition wall through which said divisional spaces communicate with each other, and means for changing evacuation conductance through said opening, wherein said first and second ion pumps are arranged in said divisional spaces, respectively.

15. A charged particle beam apparatus according to claim 14, further comprising a hermetical non-magnetic electrically conductive material covers over said permanent magnet and includes a deformable portion.

16. A charged particle beam apparatus according to claim 15, wherein said deformable portion is in a form of a ring shaped diaphragm groove.

17. A charged article beam apparatus comprising:
a charged particle beam source for emitting a charged particle beam;
a charged particle beam focusing optics for focusing the charged particle beam rom said charged particle beam source on a surface of a specimen;
a column for housing said charged particle beam source and said optics
a first ion pump including a permanent magnet, said first ion pump being arranged in a space inside said column and surrounding said charged particle beam focusing optics and being operated to evacuate surrounding said space of said charged particle beam source to vacuum;
a second ion pump arranged in said space and surrounding said charged particle beam focusing optic
a preparatory evacuation system for preparatorily evacuating the interior space of said column, a communication opening provided between said column and said preparatory evacuation system through which the interior space of said column communicates with said preparatory evacuation system, and means for changing evacuation conductance through said communication opening;
a specimen chamber communicating with said column, said preparatory evacuation system being connected to said specimen chamber and said communication opening being formed in a first partition wall between said specimen chamber and said column;
a second partition wall for dividing said space surrounding said optics into two divisional spaces in an axial direction of said column; and
an opening formed in said second partition wall through which said divisional spaces communicate with each other; and
means for changing evacuation conductance through said opening formed in said second partition wall, wherein said first and said second ion pumps are arranged ni said divisional spaces, respectively, one of said divisional spaces communicates with said specimen chamber through said communication opening and the other communicates with said charged particle beam source.

18. A charged particle beam apparatus according to claim 17, further comprising a hermetical non-magnetic electrically conductive material covers over said permanent magnet and includes a deformable portion.

19. A charged particle beam apparatus according to claim 18, wherein aid deformable portion is in a form of a ring shaped diaphragm groove.

20. A charged particle beam apparatus comprising:
a charged particle beam source for emitting a charged particle beam;
a charged particle beam focusing optics for focusing the charged particle beam from said charged particle beam source on a surface of a specimen;
a casing for housing said charged particle beam source and said optics;
a space defined circumferentially interiorly between said casing and said charged particle beam focusing optic; and
an ion pump arranged in said space and operated to vacuum evacuate surrounding said space of said charged particle beam source, said ion pump including a permanent magnet covered by a hermetical non-magnetic electrically conductive material.

21. A charged particle beam apparatus according to claim 20, wherein said hermetical non-magnetic electrically conductive material includes a deformable portion.

22. A charged particle beam apparatus according to claim 21, wherein said deformable portion is in a form of a ring shaped diaphragm groove.

23. An ion pup used in a charged particle beam apparatus, said ion pump comprising:
a ring-shaped permanent magnet;
an anode electrode disposed along said permanent magnet and hermetically covering said permanent magnet, wherein said anode electrode made of a non-magnetic electrically conductive material; and
a cathode electrode made of an active metal and sandwiched said anode electrode and said permanent magnet.

24. An ion pump according o claim 23 wherein each of said anode and cathode electrodes is of a ring shape.

25. An ion pump according to claim 23 wherein sad anode electrode substantially contacts said permanent magnet, and said cathode electrode is spaced apart from said permanent magnet, said ion pump further comprising a magnetic circuit arranged to surround said permanent magnet and said two electrodes and adapted to lead lines of magnetic force from said permanent magnet so as to generate a magnetic field which causes Penning discharge between said two electrodes.

26. An ion pump according to claim 25 wherein said cathode electrode includes a paired component which sandwich said anode electrode.

27. An ion pump as claimed in claim 23, wherein said anode electrode includes a deformable portion.

28. An ion pump as claimed in claim 27, wherein said deformable portion is in a form of a ring shaped diaphragm groove.

29. An ion pump used in a charged particle beam apparatus comprising:
- a ring-shaped permanent magnet arranged in a column coaxially with focusing optics for a charged particle beam;
- an anode electrode disposed along said permanent magnet and hermetically covering said permanent magnet, wherein said anode electrode made of a non-magnetic electrically conductive material; and
- a cathode electrode made of an active metal and sandwiched said anode electrode and said permanent magnet.

30. An ion pump according to claim 29 wherein each of said anode and cathode electrodes is of a ring shape.

31. An ion pump according to claim 29 wherein said anode electrode substantially contacts said permanent magnet, and said cathode electrode is spaced apart from said permanent magnet, said ion pump further comprising a magnetic circuit arranged to surround said permanent magnet and said two electrodes and adapted to lead lines of magnetic force from said permanent magnet so as to generate a magnetic field which causes Penning discharge between said two electrodes.

32. An ion pump according to claim 31 wherein said cathode electrode includes a paired component which sandwich said anode electrode.

33. An ion pump as claimed in claim 29, wherein said anode electrode includes a deformable portion.

34. An ion pump as claimed in claim 33, wherein said deformable portion is in a form of a ring shaped diaphragm groove.

35. A method of pumping down a charged particle beam apparatus, said apparatus comprising:
- a charged particle beam source for emitting a charged particle beam;
- a charged particle beam focusing optics for focusing the charged particle beam from said charged particle beam source on a surface of a specimen;
- a column for housing said charged particle beam source and said optics; and
- an ion pump means including a permanent magnet, said permanent magnet being hermetically covered with a non-magnetic electrically conductive material,
- wherein said ion pump means is arranged in a space inside said column and surrounding said charged particle beam focusing optics and is operated to evacuate surrounding space of said charged particle beam source to vacuum;
- a preparatory evacuation system for preparatorily evacuating the interior space of said column, a communication opening provided between said column and said preparatory evacuation system through which the interior space of said column communicates with said preparatory evacuation system, and means for changing evacuation conductance through said communication opening;
- a specimen chamber communicating with said column, said preparatory evacuation system being connected to said specimen chamber and said communication opening being formed in a first partition wall between said specimen chamber and said column;
- a second partition wall for dividing said space surrounding said optics into two divisional spaces in an axial direction of said column;
- an opening formed in said second partition wall through which said divisional spaces communicate with each other; and
- means for changing evacuation conductance through said opening formed in said second partition wall,
- wherein said ion pump means comprises a plurality of ion pumps arranged in said divisional spaces, respectively, one of said divisional spaces communicates with said specimen chamber through said communication opening and the other communicates with said charged particle beam source;

said method comprising the steps of:
- opening said communication opening and said opening and evacuating the interior of said column to a condition of a first vacuum by means of said preparatory evacuation system;
- closing said communication opening or adjusting conductance thereof and operating at least one of said ion pumps to evacuate the interior of said column to a condition of a second vacuum in which a vacuum degree is higher than in said first vacuum condition; and
- closing said opening or adjusting conductance thereof and operating said ion pump arranged in said divisional space in communication with said charged particle beam source to evacuate surrounding space of said charged particle beam source to a condition of a third vacuum in which a vacuum degree is higher than in said second vacuum condition.

36. A charged particle beam apparatus comprising:
- a charged particle beam source for emitting a charged particle beam;
- a charged particle beam focusing optics for focusing the charged particle beam from said charged particle beam source on a surface of a specimen;
- a column for housing said charged particle beam source and said optics; and
- an ion pump including a permanent magnet, said permanent magnet being hermetically covered with a non-magnetic electrically conductive material,
- wherein said ion pump is arranged ni a space inside sa column and is operated to evacuate surrounding said space of sad charged particle beam source to a vacuum.

37. A charged particle beam apparatus according to claim 36, further comprising a wall for separating said space into a space surrounding the charged particle beam source and another space surrounding said optics containing said ion pump, said wall being provided with an opening through which the space containing said ion pump and the surrounding space of the charged particle beam source communicates, the opening being arranged at the substantially peripheral portion of the wall and being spaced apart from the source.

38. A charged particle beam apparatus comprising
- a charged particle beam source for emitting a charged particle beam;
- a charged particle beam focusing optics for focusing the charged particle beam from said charged particle beam source on a surface of a specimen;

a casing for housing said charged particle beam source and said optics;
a space defined circumferentially interiorly between said casing and said optics;
a wall for separating said space to form a space surrounding the charged particle beam source and another space surrounding said optics;
an opening being arranged at the substantially peripheral portion of the wall and being spaced apart from the source; and
an ion pump arranged in said space surrounding said optics and operated to vacuum said surrounding space of said charged particle beam source through said opening.

* * * * *